(12) United States Patent
Barnes

(10) Patent No.: US 6,525,572 B1
(45) Date of Patent: Feb. 25, 2003

(54) TRISTATEABLE SENSE AMPLIFIER

(75) Inventor: William Bryan Barnes, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/519,409

(22) Filed: Mar. 3, 2000

(30) Foreign Application Priority Data

Mar. 25, 1999 (GB) ................................. 9906973

(51) Int. Cl.⁷ .............................................. G01R 19/00
(52) U.S. Cl. ............................... 327/52; 327/54; 327/57
(58) Field of Search ..................................... 327/52–57

(56) References Cited

U.S. PATENT DOCUMENTS

| | | | | |
|---|---|---|---|---|
| 4,010,453 A | * | 3/1977 | Lewis | 365/205 |
| 4,539,494 A | | 9/1985 | Kurafuji | 327/52 |
| 4,724,344 A | | 2/1988 | Watanabe | 327/53 |
| 4,797,583 A | | 1/1989 | Ueno et al. | 326/66 |
| 4,984,204 A | * | 1/1991 | Sato et al. | 327/52 |
| 5,508,643 A | * | 4/1996 | Khieu | 327/53 |
| 5,568,438 A | * | 10/1996 | Penchuk | 327/54 |
| 5,657,290 A | | 8/1997 | Churcher | 365/205 |
| 5,789,948 A | | 8/1998 | Kim et al. | 327/55 |
| 6,061,078 A | * | 2/2000 | Le et al. | 365/225.7 |
| 6,067,273 A | * | 5/2000 | Morgan | 327/114 |
| 6,111,446 A | * | 8/2000 | Keeth | 327/259 |
| 6,114,881 A | * | 9/2000 | Eum | 327/179 |
| 6,127,853 A | * | 10/2000 | Yu | 327/55 |
| 6,154,064 A | * | 11/2000 | Proebsting | 327/57 |

FOREIGN PATENT DOCUMENTS

EP  0 898 281  2/1999

* cited by examiner

Primary Examiner—Kenneth B. Wells
(74) Attorney, Agent, or Firm—Wolf, Greenfield & Sacks, P.C.; James H. Morris; Robert A. Skrivanek, Jr.

(57) ABSTRACT

A sense amplifier circuit has two inputs for connection to complementary bit lines and an output terminal. The circuit comprises control circuitry responsive to control input for selectively tristating the output terminal.

14 Claims, 1 Drawing Sheet

TRISTATEABLE SENSE AMPLIFIER

FIELD OF THE INVENTION

The present invention relates to a sense amplifier circuit, and more particularly to a differential sense amplifier having a single-ended output.

BACKGROUND OF THE INVENTION

Semiconductor memories are of two main types, dynamic memories in which no dc dissipation path is active, and static memories where bistable circuits or the like consume current throughout memory operation. They conventionally have a matrix of complementary pairs of memory elements associated with suitable addressing circuitry. Each pair of complementary memory elements is accessible by a corresponding complementary pair of bit lines A circuit known as a sense amplifier is connectable to the complementary pair of bit lines to determine whether a logic one or logic zero is stored by the pair of memory elements.

Other types of memory circuitry are known in which there is only a single element storing information and in such arrangements it is known for a sense amplifier to compare the level stored in the memory element with that of a reference element so as to judge whether a logical one or a logical zero is stored in the memory element.

Like memory cells, sense amplifiers are of two main types, namely static sense amplifiers and dynamic sense amplifiers. Dynamic sense amplifiers are characterized by a substantial absence of DC current flow between the positive and negative supply lines to the amplifier whereas static sense amplifiers entail such current flow throughout their normal operation.

Known static sense amplifiers comprise circuitry forming a differential-to-single ended amplifier stage which is enabled during the sense operation, the output of which is connected to a cross-coupled latch arrangement which assumes a state determined by the output of the sense amplifier during the sense operation and which retains that state once the sense amplifier is no longer in the sensing mode. Such latch circuitry may be connected to the output of the converter circuit via a transmission gate so as to isolate the output of the converter stage from the input to the latch when the converter stage is inactive.

Providing an additional gate to enable or disable the latch connection has disadvantages, namely provision of additional delays and unnecessary utilization of chip area.

It is accordingly an object of the present invention to at least partially mitigate the difficulties of the prior art.

It is a secondary object of the present invention to provide a sense amplifier circuit having a tristatable output.

SUMMARY OF THE INVENTION

According to a first aspect of the present invention there is provided a static sense amplifier circuit having two inputs for connection to complementary bit lines, and an output terminal wherein said circuit comprises control circuitry responsive to a control input for selectively rendering said output terminal high impedance.

According to a second aspect of the present invention there is provided a sense amplifier circuit comprising a first amplifier and a second amplifier, the first amplifier having a pair of differential input nodes and a pair of differential output nodes, the second amplifier having a pair of differential input nodes and a single-ended output node, wherein the pair of differential output nodes of the first amplifier is coupled to the pair of differential input nodes at the second amplifier and the second amplifier has a further input for disabling the second amplifier whereby the output node of the second amplifier may be rendered high impedance.

According to a third aspect of the present invention there is provided sense amplifier circuitry comprising a differential-to-single ended converter and a latch, the converter having an output, the latch having an input and an output, said latch input being coupled to said output of said converter wherein said converter has a control input for causing said output of said converter to assume a high impedance state whereby said latch stores a previous state of said converter.

According to a fourth aspect of the present invention there is provided a sense amplifier circuit comprising a source-coupled pair whose control nodes are coupled to a pair of differential inputs, the drains of said pair being coupled to the control nodes of a further source-coupled pair wherein the common source of the further source-coupled pair is connected via a switched impedance to a negative supply terminal, the drains of the further source-coupled pair are connected to a positive supply via a current mirror circuit and one drain of said further source-coupled pair forms an output terminal.

Conveniently the switched impedance comprises a field effect transistor.

Preferably the source-coupled pair and the further source-coupled pair are n-type transistors.

Advantageously the outputs of the source-coupled pair are further connected to the control electrodes of a pair of transistors whose main current paths are connected between the common source electrodes of the source-coupled pair and a negative supply terminal to provide common mode feedback.

Conveniently the source-coupled pair has a switchable active load.

Preferably the output terminal is connected to a latching circuit.

Conveniently the latching circuit is a latch having a forward path and a feedback path wherein the feedback path is weak compared to the forward path whereby the latch changes state in response to a relatively small input change.

BRIEF DESCRIPTION OF THE DRAWINGS

An embodiment of the present invention will now be described with reference to the accompanying drawings in which the sole FIGURE shows a schematic drawing of a sense amplifier circuit in accordance with the present invention.

DESCRIPTION OF THE PREFERRED EMBODIMENTS

Figure 1:
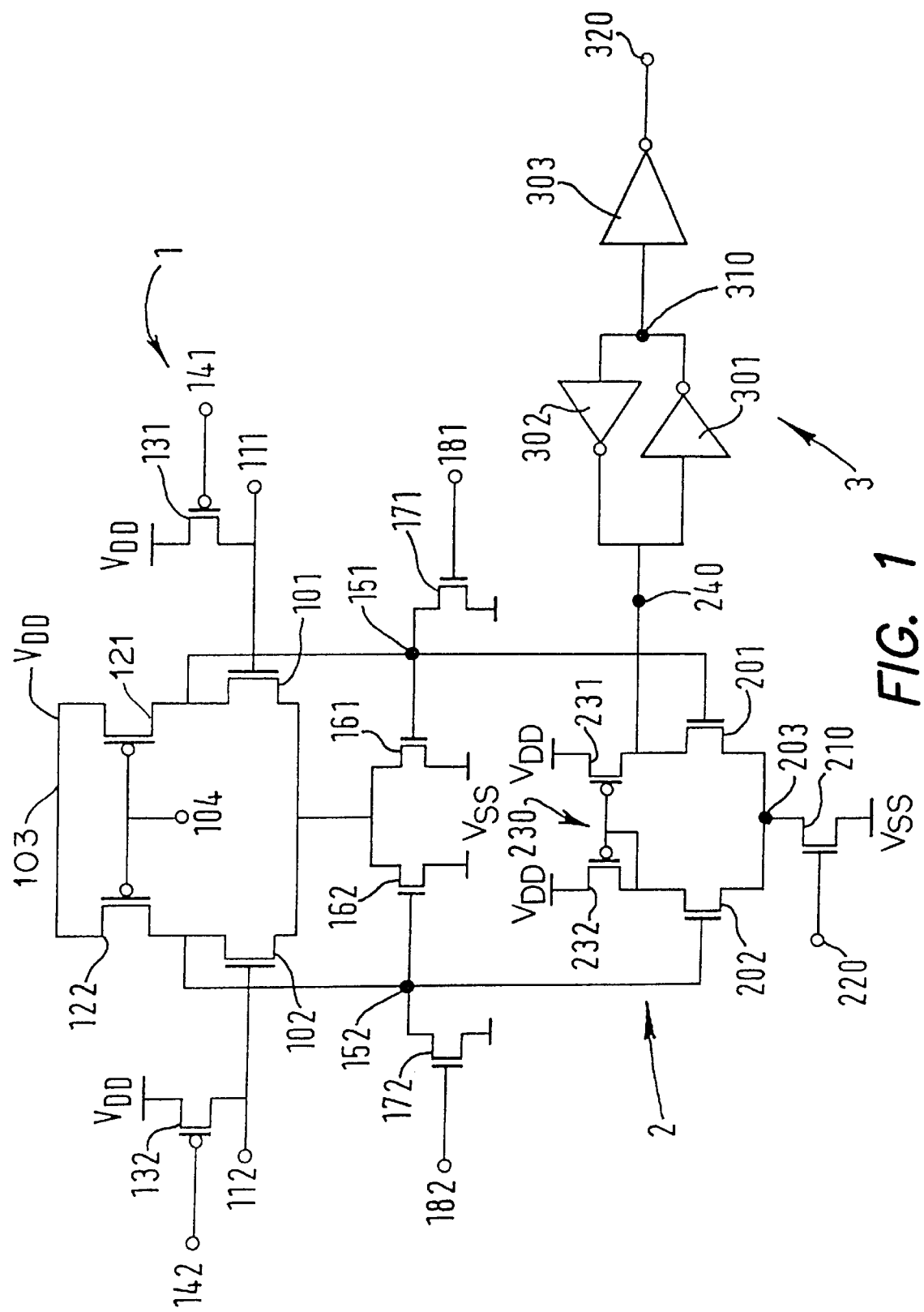

Referring to the FIG. 1, the sense amplifier circuit consists generally of a differential-to-differential amplifier 1, a differential-to-single-ended converter 2 and a latch 3.

The full differential amplifier 1 has a first source-coupled pair 100 of relatively wide n-type transistors 101, 102, whose gates are connected to first and second complementary bit lines 111 and 112. The drains of the transistors 101, 102 are connected to a positive supply 103 via an active load circuit consisting of two relatively wide p-type transistors 121, 122 whose main current paths connect the drains of transistors 101 and 102 to the positive supply 103.

The gates of the p-type load transistors 121, 122 are connected in common at a node 104.

Respective small pullup p-type transistors 131, 132 selectively connect the bit lines 111 and 112 to the positive supply VDD, the gates of these transistors being connected respectively to input terminals 141 and 142.

The drain of transistor 101 is connected to a circuit node 151 and the drain of transistor 102 is connected to a circuit node 152. The circuit nodes 151 and 152 are connected to respective drains of n-type bias transistor s 161 and 162, the bias transistors having a common drain connected to the common source of source-coupled pair 100 and the sources of transistors 161 and 162 being connected to a negative supply rail VSS.

Circuit nodes 151 and 152 are further connected to the drains of respective small n-type clamping transistors 171, 172, the sources of which are also connected to the negative supply rail VSS. The control terminals of the clamping transistors 171 and 172 are connected to terminals 181 and 182.

The differential-to-single-ended converter 2 has a further source-coupled pair 200 consisting of respective n-type transistors 201 and 202. The control gates of these transistors are respectively coupled to the above-mentioned circuit nodes 151 and 152. The common source node 203 of transistors 201 and 202 is connectable to the negative supply VSS via an n-type control transistor 210 whose gate is connected to a control terminal 220.

The drains of the further source-coupled pair 200 are connected to the positive supply VDD via a current mirror circuit 230 which consists of a pair of p-type transistors 231 and 232. Transistor 232 is diode-connected between the drain of transistor 202 and the positive supply rail and transistor 231 is connected between the drain of transistor 201 and the positive supply rail. The control electrodes of transistors 231 and 232 are, in known fashion, connected in common.

The common node of transistors 201 and 231 forms a converter output terminal 240.

Latch circuit 3 consists of a latch made up of two cross-coupled inverters 301 and 302. The first latch 301 is connected with its input to converter output terminal 240 and its output to a latch node 310. The second inverter 302 forms the latch positive feedback path, having its input at latch node 310 and its output connected to converter output terminal 240. The latch node 310 is connected to sense amplifier circuit output terminal 320 via a third inverter 303 which acts as a buffer. The current capacity of the feedback inverter 302 is around an order of magnitude lower than that of the forward inverter 301 so that the feedback path is much weaker than the forward path. As a result, a relatively small excursion at converter output terminal 240 is sufficient to flip the latch into an opposite state.

The operation of the sense amplifier circuit will now be described. Before a sensing operation takes place a high signal is supplied to control terminals 141 and 142 causing the p-type transistors 131 and 132 to cut off. Then, assuming for example the charge on first bit line terminal 111 is higher than that on second bit line 112, the first source-coupled pair 100 will be unbalanced with the n-type transistor 101 which is connected to first bit line 111 conducting more strongly than the n-type transistor 102 connected to second bit line 112. Conduction takes place through the active load circuit composed of p-type transistors 121 and 122 such that the potential at node 151 is lower than the potential at node 152.

In the described preferred embodiment, the gain of the amplifier is around 2.5, so that the potential difference between nodes 151 and 152 is approximately 2.5 times the potential difference between bit lines 111 and 112.

It will be noted that the current source supplying the common sources of the first source-coupled pair 100 is furnished by two n-type transistors 161 and 162 which are controlled by the nodes 151 and 152. This circuit arrangement provides common mode feedback so that if, for example, both bit lines 111 and 112 are at a relatively high common mode potential-albeit still having a differential mode potential—the effect will be that the transistors 101 and 102 of the source-coupled pair will both be turned on more than if the common mode potential of bit lines 111 and 112 was relatively low. The high common mode control would, without the two transistors 161 and 162 result in the nodes 151 and 152 both being at a low common mode potential which could provide problems in the differential-to-single-ended stage 2. However, a tendency for low common mode potentials at nodes 151 and 152 results in transistors 161 and 162 both conducting relatively less so that the source-coupled pair has a relatively reduced tail current which results in turn in the common mode voltage at the drains and thus at the nodes 151 and 152 being restored to the desired nominal value, suitable for the differential-to-single-ended converter 2.

It will be recalled that the potential at node 151 is relatively lower than that at node 152, given the circuit conditions assumed here, and that these potentials provide the input potentials to the further source-coupled pair 200 of the differential-to-single ended converter 2.

As a result, the first transistor 201 of the further source-coupled pair 200 conducts less than the second transistor 202 of the source-coupled pair. The second transistor 202 of the first source-coupled pair 200 is connected to the diode connected transistor 232 of the current mirror circuit 230. As is known to those skilled in the art, the bias on the diode connected transistor 232 caused by the current through the second transistor 202 of the further source-coupled pair 200 is applied to the control electrode of the controlled transistor 231 of the current mirror circuit 230 so that the current produced by the controlled transistor is equal to that in the diode-coupled transistor 232. As a consequence, it being recalled that the first transistor 201 is conducting a lower current than that in the second transistor 202, the controlled transistor 231 will be conducting more current than can be sunk by the first transistor 201 causing the converter output terminal 240 to rise to a relatively high potential. It will be understood of course that for the purposes of this discussion the N-type control transistor 210 is rendered conductive.

Given the opposite circuit conditions to those described above, namely where the potential on the second bit line 112 is higher than that on the first bit line 111, the effect by analogy is that the second transistor 202 of the further source-coupled 200 conducts less than the first transistor 201 of the further source-coupled pair. In this case, it will be understood by those skilled in the art that the controlled transistor 231 of the current mirror circuit 230 conducts less current than is being sunk via the first transistor 201 of the further source-coupled pair 200, which thus draws the converter output terminal 240 to a relatively low potential.

When the converter output terminal 240 is at a high potential, the latch 3 is set to a condition in which the latch mode 310 is at a low potential and the output terminal 320 is at a high potential. When the converter output terminal is at a low potential, the latch node 310 is at a high potential and the output node 320 at a low potential.

The circuit described so far will operate effectively in steady state conditions. However, as known to those skilled in the art, connection of memory cells to bit lines does not give rise to an instant change in potential on the bit lines due to the necessity for the bit lines to charge. It is necessary to retain the output at output terminal 320 between the end of one sense cycle and the next. To do that it is required to provide a condition in which no disturbances are applied to the converter output terminal 240, as such disturbances could set or reset the latch 3.

In the embodiment described, this is achieved by applying a high potential to the terminals 181 and 182 thereby to turn on the clamping transistors 171 and 172. The high potential is applied first, and then shortly afterwards a low potential is applied to control terminal 220 of N-type control transistor 210 of the differential-to-single ended converter circuit.

When the control transistor 210 is turned off, the common source node 203 no longer has a source current sink applied to it, so neither transistor 201 nor transistor 202 will conduct. As a result, the diode connected transistor 232 of the current mirror circuit 203 assumes the diode state in which the control gate is at one threshold voltage below the VCC positive power potential causing the controlled transistor 231 to become non-conductive. It will therefore be seen that the converter output terminal 240 is coupled by a non-conductive controlled transistor 231 to the positive supply rail and via a non-conductive path comprising first transistor 201 and tail control transistor 210 to the negative supply rail VSS.

If a logic one were previously present on the converter output 240, there is no path that would allow this to dissipate, even in the absence of the clamping transistors 171 and 172. If however the node 240 were at a logic zero, it is possible for transistor 201 to conduct and allow the logic zero to become corrupt, in the absence of the clamping transistors 171 and 172 holding the control nodes of the further source-coupled pair to ground potential.

What is claimed is:

1. A static sense amplifier circuit having two inputs for connection to complementary bit lines and an output, wherein said circuit comprises control circuitry responsive to assertion of at least one control signal for selectively tristating the output so that current is neither sourced to nor sunk from the output and a value of the output does not change from its previous value during the assertion of the at least one control signal.

2. A sense amplifier circuit, comprising:

a first amplifier and a second amplifier, the first amplifier having a pair of differential input nodes and a pair of differential output nodes, the second amplifier having a pair of differential input nodes and a single-ended output node, wherein the pair of differential output nodes of the first amplifier is coupled to the pair of differential input nodes of the second amplifier; and control circuitry for disabling the second amplifier whereby the output node of the second amplifier is tristated, the control circuitry including a pair of controllable clamping transistors for selectively holding the differential input nodes of the second amplifier at a reference potential.

3. Sense amplifier circuitry, comprising a differential-to-single ended converter and a latch, the converter having a pair of differential inputs and an output and further having a pair of controllable clamping transistors connected between the differential inputs and a reference potential, the latch having an input and an output, the latch input being coupled to the output of the converter wherein the converter has a control input for causing the output of the converter to assume a high impedance state whereby the latch stores a previous state of the converter.

4. A sense amplifier circuit comprising a first source-coupled pair of transistors whose control nodes are coupled to a pair of differential inputs, drains of the first source-coupled pair being coupled to control nodes of a second source-coupled pair of transistors, wherein a common source of the second source-coupled pair is connected via a switched impedance to a negative supply terminal, wherein the switched impedance has a control input responsive to a control signal, and wherein drains of the second source-coupled pair are connected to a positive supply via a current mirror circuit and one drain of the second source-coupled pair forms an output terminal, the sense amplifier circuit further comprising a pair of controllable clamp devices connecting the control nodes of the second source-coupled pair to a reference terminal in response to a disable signal whereby the control signal is operative to tristate the output terminal.

5. The sense amplifier circuit of claim 4 wherein the switched impedance comprises a field effect transistor.

6. The sense amplifier circuit of claim 4 wherein the first source-coupled pair and the second source-coupled pair are n-type transistors.

7. The sense amplifier circuit of claim 4 wherein the first source-coupled pair has a switchable active load.

8. The sense amplifier circuit of claim 4 wherein the output terminal is connected to a latching circuit.

9. The sense amplifier circuit of claim 8 wherein the latching circuit is a latch having a forward path and a feedback path wherein the feedback path is weak compared to the forward path whereby the latch changes state in response to a relatively small input change.

10. A sense amplifier circuit comprising a first source-coupled pair of transistors whose control nodes are coupled to a pair of differential inputs, drains of the first source-coupled pair being coupled to control nodes of a second source-coupled pair of transistors, wherein a common source of the second source-coupled pair is connected via a switched impedance to a negative supply terminal, wherein the switched impedance has a control input responsive to a control signal, and wherein drains of the second source-coupled pair are connected to a positive supply via a current mirror circuit and one drain of the second source-coupled pair forms an output terminal, the sense amplifier circuit further comprising a pair of controllable clamp devices connecting the control nodes of the second source-coupled pair to a reference terminal in response to a disable signal whereby the control signal is operative to tristate the output terminal;

wherein outputs of the first source-coupled pair are further connected to control electrodes of a pair of transistors whose main current paths are connected between the common source electrodes of the first source-coupled pair and the negative supply terminal to provide common mode feedback.

11. A sense amplifier circuit comprising a source-coupled pair whose control nodes are coupled to a pair of differential inputs, the drains of said pair being coupled to the control nodes of a further source-coupled pair wherein the common source of the further source-coupled pair is connected via a switched impedance to a negative supply terminal, the drains of the further source-coupled pair are connected to a positive supply via a current mirror circuit and one drain of said further source-coupled pair forms an output terminal, wherein the outputs of the source-coupled pair are further connected to the control electrodes of a pair of transistors whose main current paths are connected between the common source electrodes of the source-coupled pair and a negative supply terminal to provide common mode feedback.

12. The sense amplifier of claim 11 wherein the source-coupled pair has a switchable active load.

13. The sense amplifier of claim 11 wherein the output terminal is connected to a latching circuit.

14. The sense amplifier of claim 13 wherein the latching circuit is a latch having a forward path and a feedback path wherein the feedback path is weak compared to the forward path whereby the latch changes state in response to a relatively small input change.

\* \* \* \* \*